United States Patent [19]
Jang et al.

[11] Patent Number: 5,552,017
[45] Date of Patent: Sep. 3, 1996

[54] METHOD FOR IMPROVING THE PROCESS UNIFORMITY IN A REACTOR BY ASYMMETRICALLY ADJUSTING THE REACTANT GAS FLOW

[75] Inventors: Syun-Ming Jang, Hsin-Chu; Chen-Hua Yu, Keeling City, both of Taiwan

[73] Assignee: Taiwan Semiconductor Manufacturing Company, Hsin-Chu, Taiwan

[21] Appl. No.: 563,142
[22] Filed: Nov. 27, 1995
[51] Int. Cl.6 .................................................. C23C 16/00
[52] U.S. Cl. .................... 156/643.1; 156/657.1; 156/345; 427/569; 427/248.1; 118/715; 118/723 E
[58] Field of Search ............................... 118/715, 723 E; 427/569, 248.1; 156/345, 643.1, 657.1

[56] References Cited

U.S. PATENT DOCUMENTS

| | | | |
|---|---|---|---|
| 5,000,113 | 3/1991 | Wang | 118/715 |
| 5,328,867 | 7/1994 | Chien et al. | 437/191 |

FOREIGN PATENT DOCUMENTS

| | | | |
|---|---|---|---|
| 3281780 | 12/1991 | Japan | 118/715 |

*Primary Examiner*—Richard Bueker
*Attorney, Agent, or Firm*—George O. Saile

[57] ABSTRACT

A method for improving the etch rate uniformity and the chemical vapor deposition uniformity in a single-wafer reaction chamber was achieved. The method utilizes an asymmetric gas distribution system to increase the reactant gas flow over regions of the wafer in an etcher where the etch rates are low, and increases the reactant gas flow in CVD deposition reactors over regions of the wafer where the deposition rates are low. More specifically, a modified shower head having an array of orifices that are varied in size and spacing across the shower face are proposed to optimize the uniformity. The method is particularly useful for improving the uniformity near the wafer flat where the uniformity is known to be exceptionally poor in conventional single-wafer reactors.

21 Claims, 3 Drawing Sheets

METHOD FOR IMPROVING THE PROCESS UNIFORMITY IN A REACTOR BY ASYMMETRICALLY ADJUSTING THE REACTANT GAS FLOW

BACKGROUND OF THE INVENTION

1. Field of the Invention

The present invention relates to apparatus and methods for depositing and etching films on semiconductor substrates for integrate circuits, and more particularly is related to a method for improving the reactant gas flow distribution in a process chamber for more uniform deposited film and more uniform etch rates.

2. Description of the Prior Art

Chemical Vapor Deposition (CVD) of films and patterning of films using photolithographic techniques and plasma etching (dry etching) are used extensively by the semiconductor industry for fabricating integrated circuits on semiconductor substrates. The deposition and etching processes are performed in either a batch or single-wafer reactive chamber. However, because of the increase in the diameter of the substrate over the years, the trend in the industry is to single-wafer chamber processing. For example, improvements in the growth of single crystal silicon ingots, usually by the Czochralski method, the wafer cut from the ingot have increased significantly over the past years. For example, in the early 1970's the wafer were only about 1.25 inches in diameter, and currently wafers having a 6.0 inch diameter are commonly used in semiconductor manufacturing lines. By the year 2000 the wafer diameter is expected to double to about 12 inches. For these larger wafers the trend in the semiconductor industry is to use single-wafer processing (reactive) chambers which have economic and other practical advantages. For example, the single-wafer chambers can be clustered around a single vacuum load-lock system to provide a sequence of processing steps without exposing the chamber or wafers to the ambient. These cluster systems are also easier to automate than the batch-wafer chambers. FIG. 1 shows a simplified schematic top view of a cluster system in which three single-wafer process chambers A, B and C are attached to the load-lock 3. The wafer are automatically loaded from cassette 1 in the portion the load-lock area 6 into the single-wafer chambers by the mechanical arm 4. Shown in FIG. 1 are wafers 10 and 11 loaded in chambers A and B, respectively and wafer 12 still on the transport mechanism 4 about to be loaded onto the substrate electrode 7 in chamber C.

When the single-wafer chamber are used in the conventional plasma etch mode, (FIG. 2) the etchant gas mixtures 32 are distributed in the chamber through a gas distribution system, such as the shower head 32 shown in FIG. 2. That distributes the reactant gas evenly over the wafer. The shower head 32 also serves as the top electrode to which is applied radio frequency (RF) power from a generator 36 through an impedance matching circuit 35. The substrate electrode 7 is usually electrically grounded, and water cooled. Alternatively, another method of etching with a plasma is in the reactive ion etch (RIE) mode. As shown in FIG. 3, in the RIE mode the top electrode is electrically grounded and the RF power is applied to the substrate electrode 7 using the RF generator 36 and impedance matching circuit 35 to generate the plasma. A blocking capacitor 40 is also used in series with the matching circuit 35 to provide the self-biasing (DC) voltage on the substrate electrode 7 for the directional etching. The wafer 10 on the substrate electrode 7 is usually kept cool by cooling the electrode with water.

When a single-wafer reaction chamber is used to deposit a film by chemical vapor deposition (CVD) on a wafer, the substrate electrode is electrically grounded an thermally heated, such as by a resistive element in the substrate electrode, as depicted in FIG. 4, or by radiant heating through a quartz window. The reactant gas used for deposition is also distributed through a shower head 32 uniformally across the wafer 5 on the substrate electrode 7, also shown in FIG. 4. Typically in the low pressure chemical vapor deposition (LPCVD) or plasma enhanced chemical vapor deposition (PECVD) mode the film deposition on the wafer is reaction rate limited at the wafer surface, and is therefore strongly dependent on the wafer temperature. Also, non-uniform gas phase concentrations produced by local depletion of the reactant gases can result in non-uniform deposition, especially at asymmetries on the wafer, such as at the wafer flat.

It is important that the chemical vapor deposited films and the dry etch process are uniform across the wafer in these single-wafer process chamber so as to avoid over-etching the underlying layer when the layer is patterned. For example, in todays high density semiconductor circuits having field effect transistors (FETs), the gate electrode is usually patterned from a polysilicon or silicide layer which is deposited to a thickness of between 2000 to 4000 Angstroms over a very thin gate oxide which is usually less than 100 Angstroms. Therefore, excessive over etching because of non-uniform layers or/and non-uniform etching can damage the device structures in the over etched regions on the wafer, thereby reducing chip yield. Critical device dimensions, such as FET channel lengths under the gate electrode (now less than 0.5 um) can also be effected by excessive over etch which can increase the etch bias.

Unfortunately, during processing the deposition uniformity for the LPCVD and the etch uniformity are also effected by the wafer shape. More specifically the flat that is formed along the ingot to identify the specific crystal direction, and is used to align the wafer during photolithographic exposure and automatic wafer handling can also perturb the deposition and etching rates during processing resulting in non-uniformities. Therefore, there is still a strong need in the semiconductor industry to provide a method for improving the LPCVD deposition and plasma etching uniformity during wafer processing.

SUMMARY OF THE INVENTION

In view of the above mentioned short comings in single-wafer process chambers, mainly the non-uniform etching and CVD film deposition on wafers, it is a principle object of this invention to provide a method for improving the uniformity on the wafer adjacent to the wafer flat.

It is another object of this invention to provide this improved uniformity in plasma etching and deposition by providing an asymmetric gas flow distribution system in the process chamber using a modified shower head to compensate for the non-uniformities resulting from the presence of the wafer flat on the wafer.

It is still another object of this invention to provide this improved uniformity while maintaining a cost effective manufacturing process.

The method for providing a plasma etch process with improved etch rate uniformity is described in a first embodiment in which a single wafer etching chamber is provided having a high vacuum pumping package for evacuating the chamber, comprising, for example, of a turbomolecular pump and a mechanical backing/roughing pump. An adjustable throttle valve interposed in the exhaust line between the chamber and the turbomolecular pump is used in conjunction with a pressure gauge, such as a capacitor manometer to control and maintain a constant pressure during the etching process. Also provided are mass flow controllers and gas monitor meters for mixing and controlling the flow rates of the gases used for etching, referred to hereafter as the etchant gas or reactant gas. The etchant gas, by the method of this invention, is distributed asymmetrically through a gas distribution system (modified shower head) aligned over the wafer to be etched which resides on a substrate electrode in the chamber. More specifically the gas distribution system consists of a modified shower head having an array of orifices of varying size and spacing, and is aligned over the wafer to provide an asymmetric distribution of etchant gas so as to improve the etch uniformity of the etching for films being patterned on the wafer. More specifically, the method is used to modify the etchant gas flow rate and hence the etch rate uniformity near the flat formed on the wafers commonly used to identify the wafer crystal axis, and more recently is also used for automatic wafer handling, such as during photolithographic step and repeat exposures, and wafer loading in single-wafer process chambers on multi-chamber systems.

The asymmetric gas distribution system (shower head) is equally applicable in the plasma etch mode or in the reactive ion etch (RIE) mode. In the plasma etch mode the radio frequency power is applied to the shower head which also functions as a top electrode, while the substrate electrode on which resides the wafer is usually electrically grounded. In the RIE mode the RF power is applied to the substrate electrode and the shower head is usually grounded.

A second embodiment of this invention uses an asymmetric gas distribution system (modified shower head), for the purpose of improving the deposition uniformity of chemical vapor deposited films adjacent to the wafer flat on wafers in a single-wafer CVD reactant chamber (reactor). The chamber is similar in design to the plasma etch chamber, except the substrate electrode is heated to bring about the decomposition of the reactant gas and film deposition on the wafer surface. The gas distribution system, such as the modified shower head is also modified to provide the asymmetric distribution necessary for uniform deposition near the wafer flat. As in the plasma etch configuration, RF power can also be applied to the top electrode (modified shower head) to effectively provide films by plasma enhanced chemical vapor deposition (PECVD) at lower temperature having improved uniformity across the wafer and especially near the wafer flat.

BRIEF DESCRIPTION OF THE DRAWINGS

The objects and other advantages of the invention are best understood with reference to the preferred embodiments when read in conjunction with the following drawings.

DESCRIPTION OF THE PREFERRED EMBODIMENTS

Figure 1:
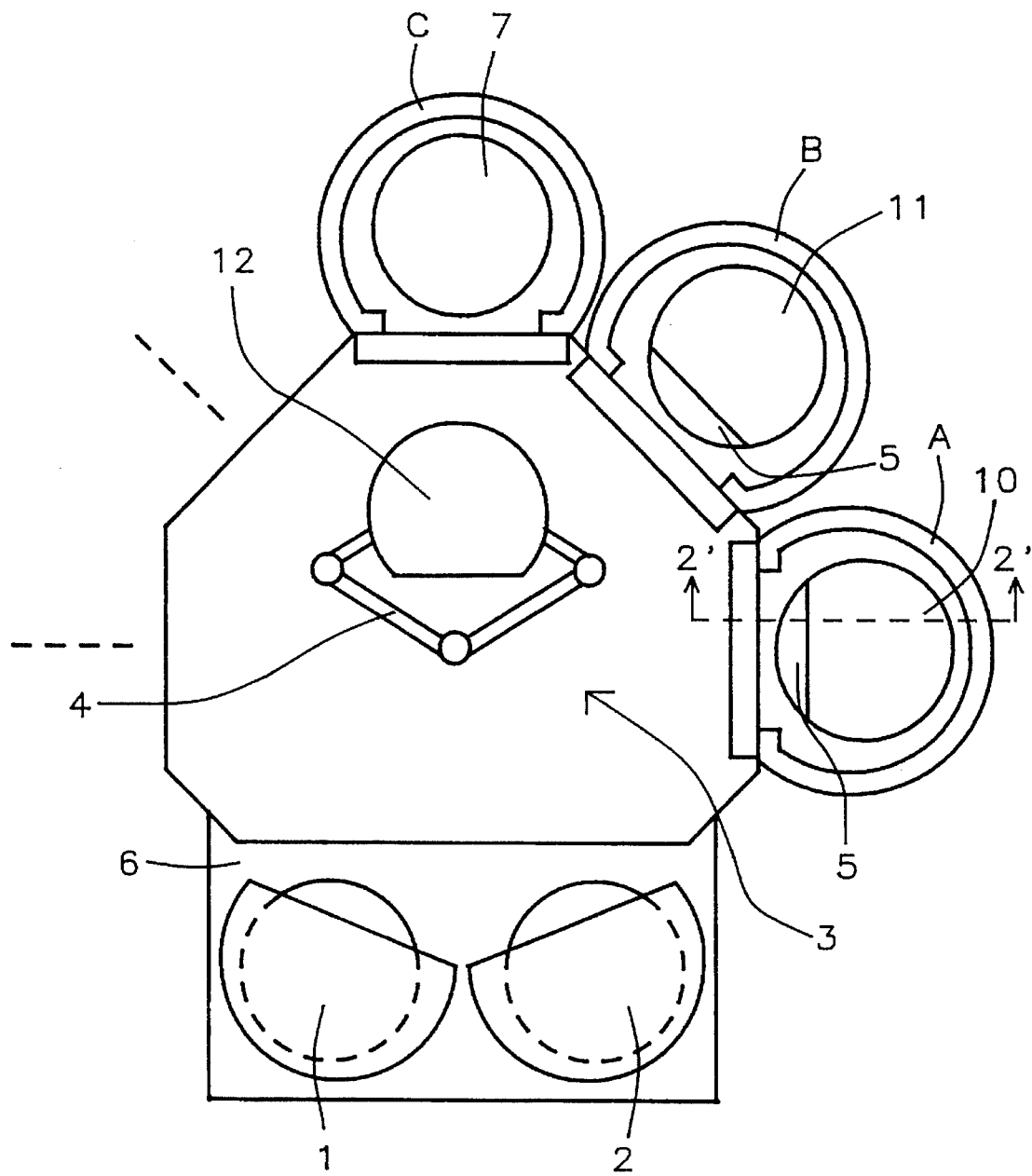
FIG. 1 is a simplified schematic top view of a multi-chamber system showing the common load-lock chamber and having three single wafer process chambers.

Prior to describing the apparatus for asymmetrically disturbing the reactant gas for improving the etch rate and deposition rate uniformity, a brief review of the use of a multi-chamber system would be helpful in putting the invention in perspective. Although the method can be used in a stand-alone single-wafer processing chambers, the method is particularly usefully in cluster or multi-chamber systems, such as the simplified schematic of one shown in FIG. 1. Only the key elements are shown to simplify the discussion. Shown in FIG. 1 is a cut-away schematic top view of a cluster tool having a load-lock area 3 and three of the five available ports occupied by single-wafer chambers A, B and C. Also shown are the two cassettes 1 and 2 that are placed in the load-lock area 6 from which the wafers are automatically loaded in the single-wafer chambers for processing (from cassette 1) and unloading after processing (to cassette 2). The automatic loading mechanical arm 4 extracts the wafer (such as wafer 12 in FIG. 1) from cassette 1 and loads the wafer into the process chamber using the wafer flat 5 on the wafer to identify the wafer orientation and align the wafer on the substrate electrodes 7 in the chambers. Typically, the wafers are oriented with each of the wafer flat aligned in the same direction each time in each chamber,as depicted for wafers 10 and 11 in chambers A and B, respectively, and also shown for wafer 12 about to be loaded in chamber C, For this particular system the wafer flats are shown oriented facing the load-lock chamber 3. This makes it feasible, by the method of this invention, to design and install an asymmetric gas distribution system for each of the single-wafer chambers that allows the variation in flow rate of the reactant gas to be controlled relative to the wafer flat. For example, one specific type of asymmetric gas distribution system is the modification of a shower head which also serves as a top electrode in some plasma etchers and in the CVD single-wafer reactors.

Figure 2:
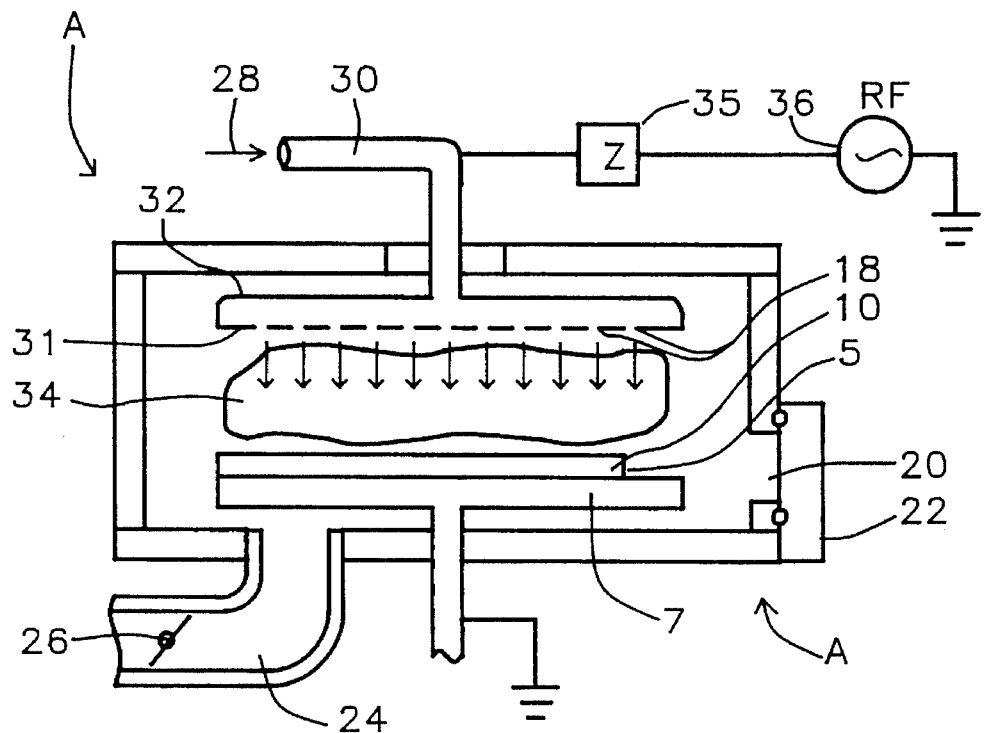
FIG. 2 is a simplified schematic cross sectional views of a single-wafer etch chamber in the plasma etch mode with the RF power applied to the top electrode which is also and modified shower head of this invention.
Figure 5:
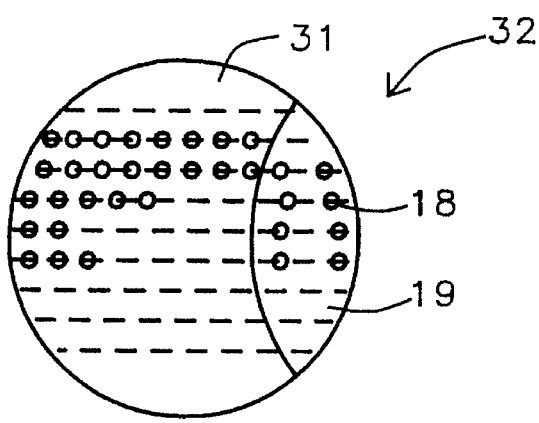
FIG. 5 is a top view of the modified shower head 32 showing the portion 19 which is modified to provide the asymmetric gas distribution for improving the deposition or etch uniformity.

Now by the method of the first embodiment, the design and utilization of asymmetric gas distribution system (shower head) is described with reference to FIGS. 2 and 3. Referring first to FIG. 2, a schematic cross sectional view of a single-wafer plasma etch chamber A configured in the plasma etch mode is shown. The cross section view is for a chamber, such as depicted for the region 2'—2' through the chamber A shown in FIG. 1. For this plasma etch configuration the chamber contains a substrate electrode 7 which is usually electrically grounded and water cooled. A semiconductor wafer 10 to be patterned typically containing a film and a patterned photoresist mask is loaded onto the substrate electrode 7 through the load-lock port 20 with the wafer flat 5 facing the load-lock port 20. After closing the port door 22 the chamber is evacuated through the exhaust port 24 by opening the high vacuum isolation value 26 and then evacuating the chamber using a high vacuum pump (not shown in FIG. 2). For example, a turbomolecular pump with a mechanical backing pump is commonly used in the semiconductor industry. The chamber is usually evacuated to a pressure that depend on process requirements, but is typically in a range between about $1.0\,E\,-5$ to $7.0\,E\,-7$ torr. The isolation value 26 in some system also serves as the throttle value during the etching process to maintain the desired chamber pressure. After evacuating the chamber, the reactant gas mixture 28 is introduced through the inlet line 30 and into the shower head 32, which in conventional systems distributes the reactant etch gas uniformly over the wafer 10 surface. However, other electrode related effects near the wafer flat result in non-uniform etching. By the method of this invention the shower head 32 is modified to provide an asymmetric gas distribution, and thereby improve the etch rate uniformity near the wafer flat 5 with respect to the other areas of the wafer. More specifically, as shown in FIG. 2, the array of orifices 18 over the wafer flat 5 are modified to decrease the flow rate over the wafer flat 5. A frontal view 31 of the shower head 32 is shown in FIG. 5. Shown is region 19 over the wafer flat where the openings are decreased in size and/or the spacings between the orifices increased relative to the other regions of the shower head 32, thereby providing the lower etch rate at the wafer flat and improving the etch uniformity. However, to minimize the number of drawings the shower head is depicted in FIG. 5 for a second embodiment for improving the chemical vapor deposition (CVD) uniformity in which larger openings are used to increase the reactant gas flow rate over region 19.

Continuing with the etch process, as shown in FIG. 2, the etchant gases entering the modified shower head 32 through the inlet line 30 are usually premixed up-stream using commercially available mass flow controllers and flow meters (not shown in FIG. 2). The etching plasma 34 is then formed over the wafer 10 by applying radio frequency power to the shower head 32 which also doubles as the top electrode. The RF power is provided to the electrode by a RF generator 36, usually operating at 13.56 megahertz (MHz), and an impedance matching circuit 35 is used to minimize the reflected RF power.

Figure 3:
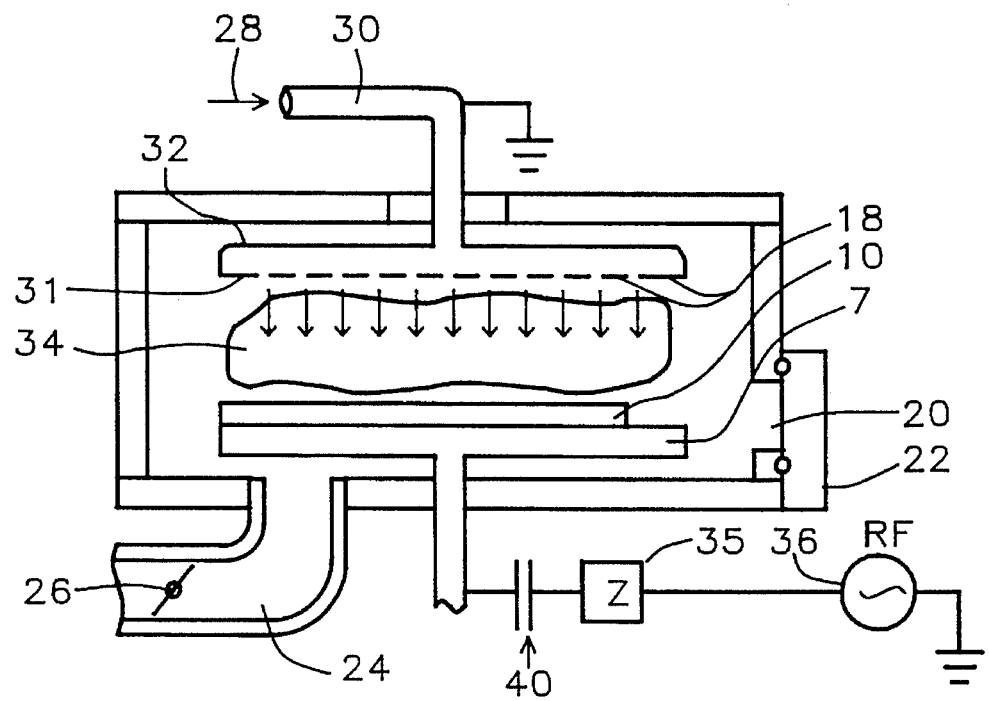
FIG. 3 is also a simplified schematic cross sectional view of a single-wafer etch chamber, but in the reactive ion etch (RIE) mode with the RF power applied to the bottom electrode.

Referring now to FIG. 3, to achieve anisotropic etching the single-wafer etch chamber can also be configured in the reactive ion etch (RIE). This is achieved by applying the radio frequency (RF) power to the substrate electrode 7 (FIG. 3) using a RF generator 36 and an impedance matching circuit 35, and electrically grounding the top electrode (modified shower head 32). A blocking capacitor 40 is also provided in series with the matching circuit 35 to provide the necessary self-biasing DC voltage for the directional etching. The remaining operation and design of the shower head is similar to the plasma etch mode describe with reference to FIG. 2.

Figure 4:
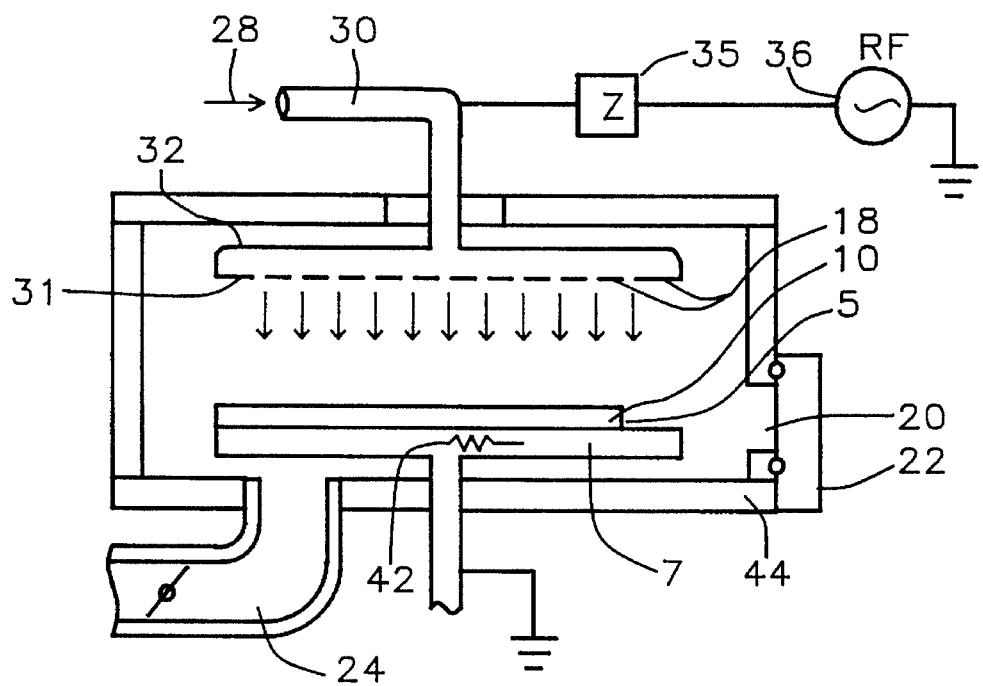
FIG. 4 is a simplified schematic cross sectional view of a single-wafer CVD reactant etch chamber (reactor) with the substrate electrode heated, and also shown is the RF power applied to the modified shower head to provide the plasma enhanced CVD mode.

Referring now more specifically to FIG. 4, a second preferred embodiment is now described for depositing a more uniform chemical vapor deposited (CVD) film using the asymmetric gas distribution system. The improved uniformity is also achieved by using the modified shower head 32 to increase the reactant gas flow near the wafer flat during deposition in a single wafer CVD reactant chamber. Typically during chemical vapor deposition (CVD) in a single wafer reactor the film thickness can be considerably non-uniform near the wafer flat. For example, during low pressure CVD or plasma enhanced CVD the deposition rate is strongly depend on a number of factors, such as depletion effects near the wafer edge, and in the reaction rate limited regime at low pressure the deposition is also strongly dependent on the wafer temperature. Therefore, there is a need to improve the film uniformity in these deposition systems. The method of this invention using the modified shower head compensates for these depletion and temperature related non-uniformity effects by increasing the reactant gas flow, such as over the wafer flat 5.

Figure 6:
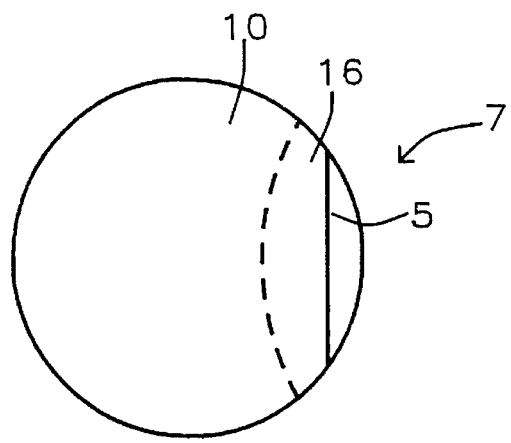
FIG. 6 shows a top view of a wafer 10 residing on a substrate electrode 7 with the wafer flat 5 on the right side of the wafer. Also depicted is the portion 16 of the wafer with poor CVD deposition or plasma etch uniformity.

Now as shown in FIG. 4, a single-wafer CVD process chamber is provided having a substrate electrode 7 that is electrically grounded and resistively heated, by using a heating element 42. Alternatively, the wafer can be heated by radiant heating through a quartz window (not shown) in the bottom plate 44 of the reactant chamber. After the substrate electrode and wafer is heated to the preferred temperature, typically between about 360° to 440 °C., the reactant gas 28 is introduced into the chamber through the gas inlet manifold 30 and is asymmetrically distributed over the wafer using the modified shower head 32. The face or front surface 31 of the shower head, as shown in FIG. 5 is designed to have an array of orifices 18 that are larger in diameter and/or are more closely spaced in the region 19 (FIG. 5) of the shower head that is aligned over the wafer flat 5, as shown in FIG. 4. A top view of the wafer 10 is also shown in FIG. 6. The region 16 on the wafer depicts the non-uniform region near the wafer flat 5. The size, spacing and distribution of the openings (orifices) depend on the exact operating conditions during deposition, and therefore, are determined experimentally by measuring the CVD film thickness uniformity.

The LPCVD single wafer reactor can also be used in the plasma enhanced mode by applying RF power to the top electrode 32 (shower head) using an RF generator 36 and an impedance matching circuit as was described for the single-wafer chamber plasma etcher.

While the invention has been particularly shown and described with reference to the preferred embodiments thereof, it will be understood by those skilled in the art that various changes in form and details may be made without departing from the spirit and scope of the invention. Particularly, it should be understood that the diameter of the orifices and their spatial distribution can be altered to provide the best etch rate and deposition rate uniformity depending on the specific process and operating parameters.

What is claimed is:

1. A method for plasma etching in a single-wafer etching chamber having improved etch rate uniformity, comprising the steps of:

providing a single-wafer etching chamber having a pumping system and a throttle valve for evacuating and maintaining a constant low pressure in said chamber;

providing gas flow controllers and gas monitor meters connected to said etching chamber, thereby controlling the flow rates of reactant gases into said etching chamber; and providing a gas distribution system in said etching chamber to asymmetrically distribute said reactant gas over a wafer having a wafer flat, said wafer resting on a substrate electrode, thereby improving the etch uniformity near the flat on said wafer during etching;

forming a plasma in said reactant gas by coupling radio frequency (RF) power to said reactant gas, and thereby plasma etching said wafer.

2. The method of claim 1, wherein said gas distribution system in said etching chamber is a shower head having an array of orifices of differing diameters and spacing to provide the necessary gas flow distribution across the surface of said wafer and adjacent to said wafer flat, thereby providing said improved etch uniformity.

3. The method of claim 2, wherein said shower head also serves as a top electrode aligned over the substrate electrode, and said radio frequency power is applied to said top electrode by means of an impedance matching circuit, and thereby providing said plasma etching.

4. The method of claim 1, wherein said RF power is applied to the substrate electrode by means of an impedance matching circuit and a blocking capacitor, and thereby provides reactive ion etching (RIE).

5. The method of claim 3, wherein said RF power is a frequency of 13.56 MHz (megahertz).

6. The method of claim 4, wherein said RF power is frequency of 13.56 MHz., and the blocking capacitor provides a DC bias on said substrate electrode for anisotropic etching.

7. The method of claim 1, wherein said asymmetric distribution of said reactant gas also compensates for the etch rate non-uniformity due to variations in the wafer loading-effects and substrate electrode edge-effects near said wafer flat.

8. A method for chemical vapor deposition of a film in a single-wafer reaction chamber having improved film uniformity, comprising the steps of:

providing a reaction chamber having a pumping system and a throttle valve for evacuating and maintaining a constant low pressure;

providing a gas flow controller and meters connected to said reaction chamber, thereby controlling the flow rates of reactant gases into said reaction chamber; and providing a gas distribution system in said reaction chamber to asymmetrically distribute said reactant gas over a wafer residing on a substrate electrode, thereby improving the film deposition uniformity near the flat on said wafer during deposition;

heating said wafer residing on said substrate electrode and thereby depositing said film.

9. The method of claim 8, wherein said gas distribution system in said deposition chamber is a shower head having an array of orifices of differing diameters and spacing to provide the necessary gas rate distribution across the surface of said wafer and adjacent to said wafer flat to provide the improved uniformity of said film.

10. The method of claim 8, wherein said substrate electrode is heated to a temperature of between about 360° to 440 ° C.

11. The method of claim 8, wherein said asymmetric distribution of said reactant gas also compensates for non-uniform deposition resulting from variations in said wafer temperature and reactant gas depletion-effects at said wafer flat.

12. The method of claim 8, wherein RF power applied to said shower head electrode through an impedance matching circuit provides a means for depositing plasma enhanced chemical vapor deposited (PECVD) films.

13. A single-wafer etching apparatus having improved etch rate uniformity, comprising of:

a single-wafer etching chamber having a pumping system and a throttle valve for evacuating and maintaining a constant low pressure in said chamber;

gas flow controllers and gas flow monitor meters connected to said etching chamber, thereby controlling the flow rates of reactant gases into said etching chamber; and a gas distribution system in said etching chamber to asymmetrically distribute said reactant gas over a wafer having a wafer flat, said wafer residing on a substrate electrode, thereby improving the etch uniformity near the flat on said wafer during etching;

a plasma in said reactant gas formed by coupling radio frequency (RF) power to said reactant gas, and thereby plasma etching said wafer.

14. The etching apparatus of claim 13, wherein said gas distribution system in said etching chamber is a shower head having an array of orifices of differing diameters and spacing to provide the necessary gas flow distribution across the surface of said wafer and adjacent to said wafer flat, thereby providing said improved etch uniformity.

15. The etching apparatus of claim 14, wherein said shower head also serves as a top electrode aligned over the substrate electrode, and said radio frequency power is applied to said top electrode by means of an impedance matching circuit, and thereby providing said plasma etching.

16. A chemical vapor deposition apparatus providing films with improved film uniformity, comprising of:

a single-wafer reaction chamber having a pumping system and a throttle valve for evacuating and maintaining a constant low pressure in said chamber;

gas flow controllers and flow monitor meters connected to said reaction chamber, thereby controlling the flow rates of said reactant gases into said reaction chamber;

a gas distribution system in said reaction chamber to asymmetrically distribute said reactant gas over a wafer residing on a heated substrate electrode, thereby improving the deposition uniformity near the flat on said wafer during deposition.

17. The chemical vapor deposition apparatus of claim 16, wherein said gas distribution system in said reaction chamber is a shower head having an array of orifices of differing diameters and spacing to provide the necessary gas rate distribution across the surface of said wafer and adjacent to said wafer flat to provide the improved uniformity of said film.

18. The chemical vapor deposition apparatus of claim 16, wherein said substrate electrode is heated to a temperature of between about 360° to 440 ° C.

19. The chemical vapor deposition apparatus of claim 16, wherein RF power applied to said shower head/electrode through an impedance matching circuit provides a means for depositing plasma enhanced chemical vapor deposited (PECVD) films having improved film uniformity near the wafer flat.

20. The chemical vapor deposition apparatus of claim 18, wherein said wafer on said substrate electrode is heated to a temperature in the range of between about 360° to 440 ° C.

21. The chemical vapor deposition apparatus of claim 18, wherein said RF power is at a frequency of between about 450 kHz to 13.56 MHz.

* * * * *